United States Patent [19]
Horii et al.

[11] Patent Number: 5,715,527
[45] Date of Patent: Feb. 3, 1998

[54] MOBILE COMMUNICATION DEVICE HAVING AN OUTPUT POWER SENSOR SUCCEEDING A TRANSMISSION FILTER

[75] Inventors: Hiroyuki Horii; Masao Iwata; Tsuyoshi Miyazawa; Koichiro Shimizu; Toshikazu Yasuoka; Akira Nakano; Katsuhiko Gunji; Tomokazu Komazaki, all of Tokyo, Japan

[73] Assignee: Oki Electric Industry Co., Ltd., Tokyo, Japan

[21] Appl. No.: 506,123

[22] Filed: Jul. 24, 1995

[30] Foreign Application Priority Data

Jul. 25, 1994 [JP] Japan ................................. 6-172317

[51] Int. Cl.$^6$ ................................. H04B 1/04; H04B 1/44
[52] U.S. Cl. ................................. 455/126; 455/80; 455/82; 455/129
[58] Field of Search ................................. 455/115–117, 126, 455/127, 129, 78, 80, 82, 83

[56] References Cited

U.S. PATENT DOCUMENTS

4,523,155  6/1985  Walczak et al. .
5,335,369  8/1994  Aisaka ................................. 455/126
5,487,179  1/1996  Larson ................................. 455/126 X Primary Examiner—Chi H. Phan
Attorney, Agent, or Firm—Spencer & Frank

[57] ABSTRACT

In a mobile communication device, a power amplifier amplifies the power of a signal to be transmitted. A transmitter filter limits the frequency band of the amplified signal to a predetermined frequency band for transmission. The signal limited in frequency band is transmitted via an antenna. Output power control circuitry controls the output power of the signal to be transmitted and has an output power sensor and an automatic power control circuit. The output power sensor succeeds the transmitter filter in the direction of flow of the signal to be transmitted, and senses the output power of the signal. The automatic power control circuit controls the gain of the power amplifier such that the output power sensed by the output power sensor coincides with a preselected reference value.

10 Claims, 5 Drawing Sheets

MOBILE COMMUNICATION DEVICE HAVING AN OUTPUT POWER SENSOR SUCCEEDING A TRANSMISSION FILTER

BACKGROUND OF THE INVENTION

1. Field of the Invention

The present invention relates to a mobile communication device, and output power control circuitry and duplexer applicable thereto.

2. Description of the Background Art

It is a common practice to provide a mobile communication device, e.g., mobile phone with output power control circuitry. The control circuitry selects one of several different output power levels matching the current distance between the mobile phone and a base station, while stabilizing the output power. We describe the conventional control circuitry with reference to FIG. 2. A power amplifier 1 amplifies the power of a signal to be transmitted, i.e., a carrier modulated by a speech signal or similar signal. The amplified signal is delivered to a transmitter filter (TX filter) 3 via a first radio frequency signal path 2. The TX filter 3 limits the input signal to a predetermined frequency band for transmission. The output of the TX filter 3 is routed through a branching circuit 4, which isolates a transmission section and a receive section, and a second radio frequency signal path 5 to an antenna. As a result, the signal to be transmitted is radiated from the antenna to the air as an electromagnetic wave.

Figure 2:
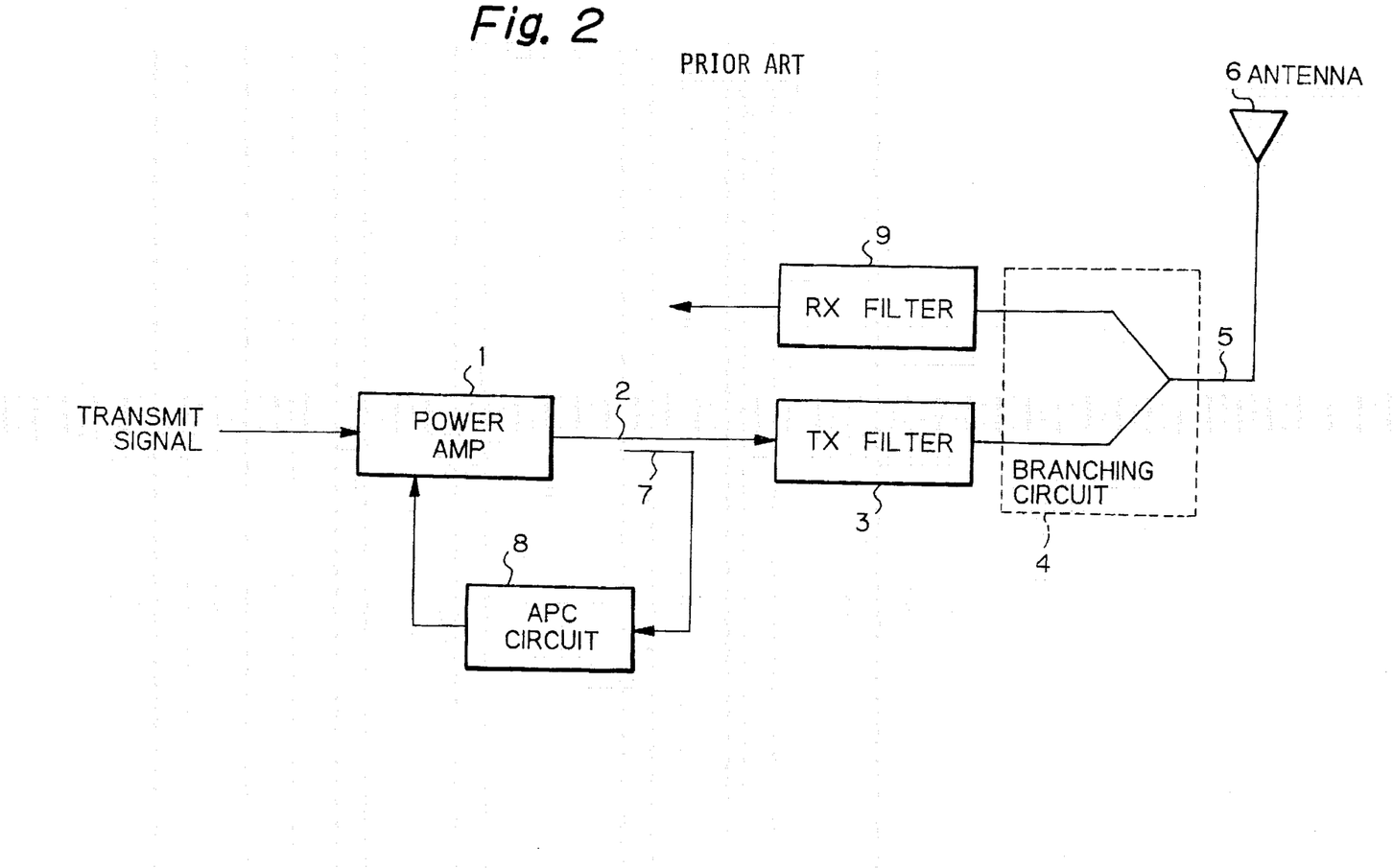
FIG. 2 is a block diagram schematically showing a conventional mobile communication device having a coupler preceding a TX filter.

A coupler 7 is inserted in the first radio frequency signal path 2. The coupler 7 produces part of the output signal of the power amplifier 1 from the path 2. The produced signal (part of the power amplifier 1 output) is fed from the coupler 7 to an automatic power control (APC) circuit 8 in the form of an electric signal. At the same time, a controller (not shown), controlling the entire mobile phone, feeds to the APC circuit 8 a reference signal indicative of power to be output from the mobile phone and matching the current distance between the mobile phone and a base station. The APC circuit 8, compares the produced signal and the reference signal and thereby generates a gain control signal for matching the former to the latter. The gasin control signal from the APC circuit 8 is applied to the power amplifier 1 so as to stabilize the output power of the power amplifier at a predetermined value.

Usually the TX filter 3 and branching circuit 4 are constructed as a single unit or part together with a receiver filter (RX filter) 9, and are put on the market as a duplexer.

The conventional output power control circuitry is capable of controlling the output signal of the power amplifier 1 to a preselected amount, as stated above. However, the conventional circuitry has the following problem left unsolved. The TX filter 3 is located to follow the power amplifier 1 and closer to the antenna 6 than the amplifier 1. In this condition, the output power of the TX filter 3 and, therefore, that of the antenna 6 has a frequency characteristic which is not flat due to the influence of the pass band deviation and low return loss of the TX filter 3. The words "pass band deviation" should be understood, throughout the following description, to refer to the fact that the attenuation factor of the TX filter 3, implemented by a band-pass filter, varies with frequencies lying in the pass band of the filter. Because the frequency of the signal to be transmitted corresponds to a channel currently occupied for transmission, the above problem means that the output power differs from one channel to another channel for transmission.

For example, a certain kind of mobile phone available today must match itself to a great number of transmission channels having a carrier frequency range of from 824 MHz to 849 MHz. The TX filter 3 is, therefore, required to have a pass band as broad as 25 MHz. In addition, the TX filter should discriminate frequencies with high accuracy at the boundaries between its pass band and frequencies outside its pass band. Consequently, some degree of pass band deviation is not avoidable in the TX filter.

To obviate the above drawback attributable to the non-flat frequency characteristic of the output power, it has been customary with a mobile phone to use a TX filter 3 having a minimum of pass band deviation. Although this kind of approach reduces the drawback, it is not a drastic measure capable of eliminating it. In these circumstances, there is a demand for an implementation capable of controlling the output power to a preselected value stably despite the pass band deviation of the TX filter.

SUMMARY OF THE INVENTION

It is, therefore, an object of the present invention to provide a mobile communication device capable of maintaining, despite the pass band deviation and low return loss of a TX filter, the output power of a signal to be transmitted constant without regard to the frequency of the signal.

It is another object of the present invention to provide new and useful output power control circuitry and duplexer for implementing the above mobile communication device.

In accordance with the present invention, a mobile communication device has a power amplifier 1 for amplifying the power of a signal to be transmitted, a TX filter for limiting the frequency band of the signal amplified by the power amplifier 1 to a predetermined frequency band for transmission, an antenna for radiating the signal limited in frequency band by the TX filter to the air, and output power control circuitry for controlling the output power of the signal to be transmitted. The output power control circuitry has an output power sensor succeeding the TX filter in the direction of flow of the signal to be transmitted, and for sensing the output power of the signal, and an automatic power control circuit for controlling the gain of the power amplifier such that the output power sensed by the output power sensor coincides with a predetermined reference value.

Also, in accordance with the present invention, output power control circuitry for a mobile communication device which amplifies the power of a signal to be transmitted by a power amplifier, limits the frequency band of the signal amplified by the power amplifier to a predetermined frequency band for transmission by a TX filter, and transmits the signal lying in the predetermined frequency band via an antenna has an output power sensor succeeding the TX filter in the direction of flow of the signal to be transmitted, and for sensing the output power of the signal. An automatic power control circuit controls the gain of the power amplifier such that the output power sensed by the output power sensor coincides with a predetermined reference value.

Further, in accordance with the present invention, a duplexer has a TX filter for limiting the frequency band of a signal to be fed to an antenna to a predetermined frequency band for transmission. A RX filter separates from a signal coming in through the antenna the frequency components lying in a predetermined frequency band for receiving. A branching circuit isolates the TX filter and the RX filter connected to the antenna. An output power sensor is provided on a transmission path included in the branching circuit, and senses the output power of the signal to be fed to the antenna.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Figure 1:
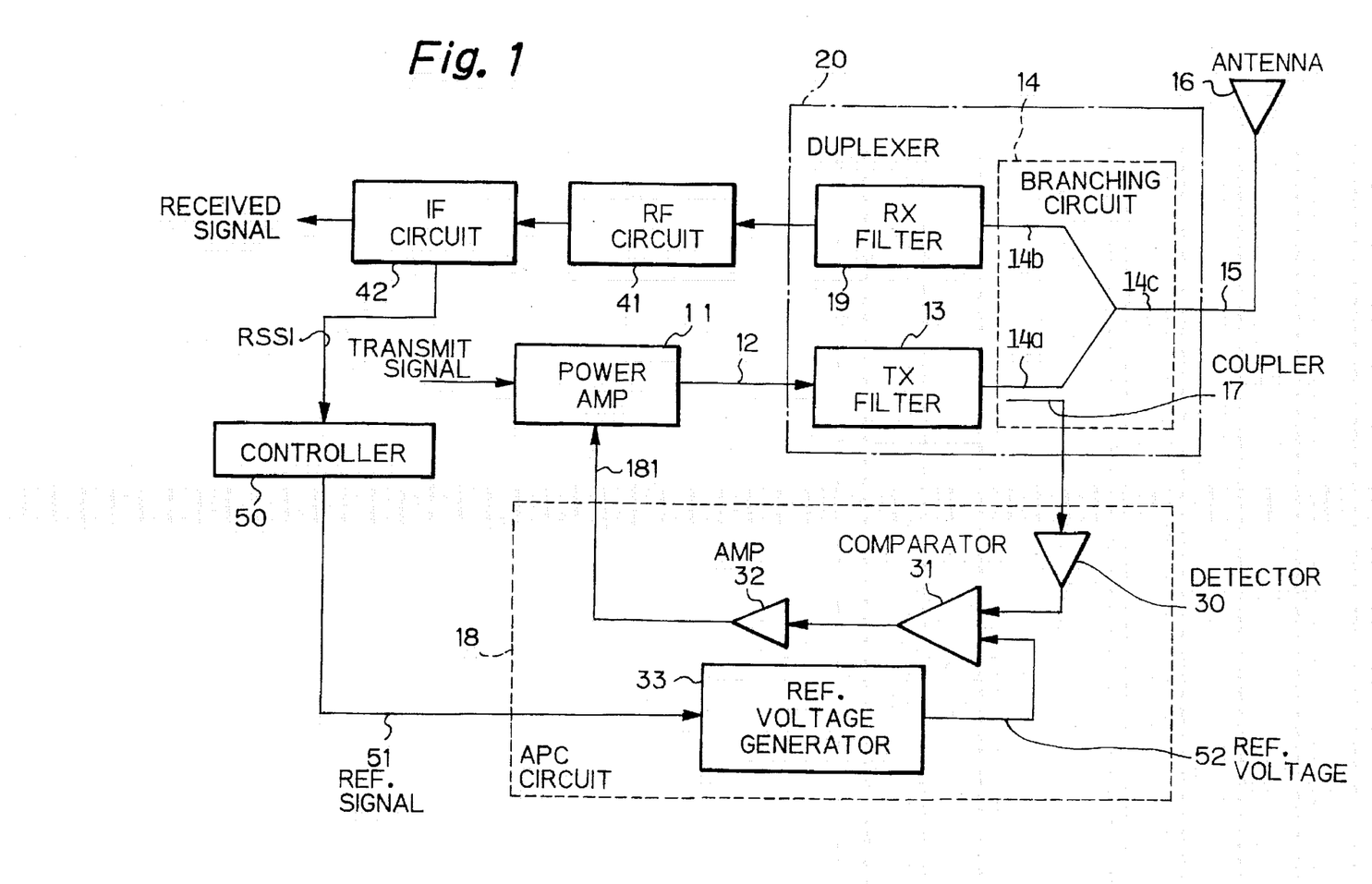
FIG. 1 is a block diagram schematically showing a mobile communication device embodying the present invention.

Referring to FIG. 1 of the drawings, a mobile communication device embodying the present invention is shown. As shown, the device has a power amplifier 11 forming part of a transmission section and connected to a duplexer 20 by a first radio frequency signal line 12. A radio frequency (RF) circuit 41 and an intermediate frequency (IF) circuit 42 form part of a receiving section. An antenna 16 is connected to the duplexer 20 by a second radio frequency signal line 15. An automatic power control (APC) circuit 18 controls the gain of the power amplifier 11, as will be described specifically later. A controller 50 controls the various constituents of the device. For example, when the controller 50 receives a received signal strength indication (RSSI) from the IF circuit 42, it generates a reference signal 51 for generating a reference voltage and feeds it to the APC circuit 18.

The duplexer 20 is made up of a TX filter 13, a RX filter 19, a branching circuit 14, and a coupler 17. These constituents 13, 19, 14 and 17 of the duplexer 20 are constructed into a single unit or part. The branching circuit 14, which isolates the transmission section and the receiving section of the device from each other, has a transmission portion 14a, a receiving portion 14b and an output portion 14c. The coupler 17 and APC circuit 18 constitute output power control circuitry in combination.

In FIG. 1, there are not shown the parts of the device not relevant to the understanding of the present invention. These parts include a circuit for modulating a carrier with a speech signal to thereby generate a signal to be transmitted, a circuit for demodulating a received signal, a dialing section, a display for displaying a telephone number and other necessary information, a speaker, and a microphone.

The signal to be transmitted is amplified by the power amplifier 11 and then applied to the TX filter 13. The TX filter 13 limits the input signal to a predetermined frequency band for transmission. The output of the TX filter 13 is routed through the branching circuit 14 and radio frequency signal line 15 to the antenna 16 and radiated from the antenna 16 to the air as an electromagnetic wave. On the other hand, a signal coming in through the antenna 16 is applied to the RX filter 19 via the branching circuit 14. The RX filter 19 separates only the signal components lying in a predetermined frequency band for receiving. The resulting output of the RX filter 19 is amplified by the RF circuit 41 where it is transformed to a first intermediate frequency signal (first IF signal). The IF circuit 42 receives the first IF signal from the RF circuit 41 and transforms it to a second intermediate frequency signal (second IF signal). At the same time, the IF circuit 42 delivers to the controller 50 the signal not transformed to the second IF as the previously mentioned RSSI.

Figure 4:
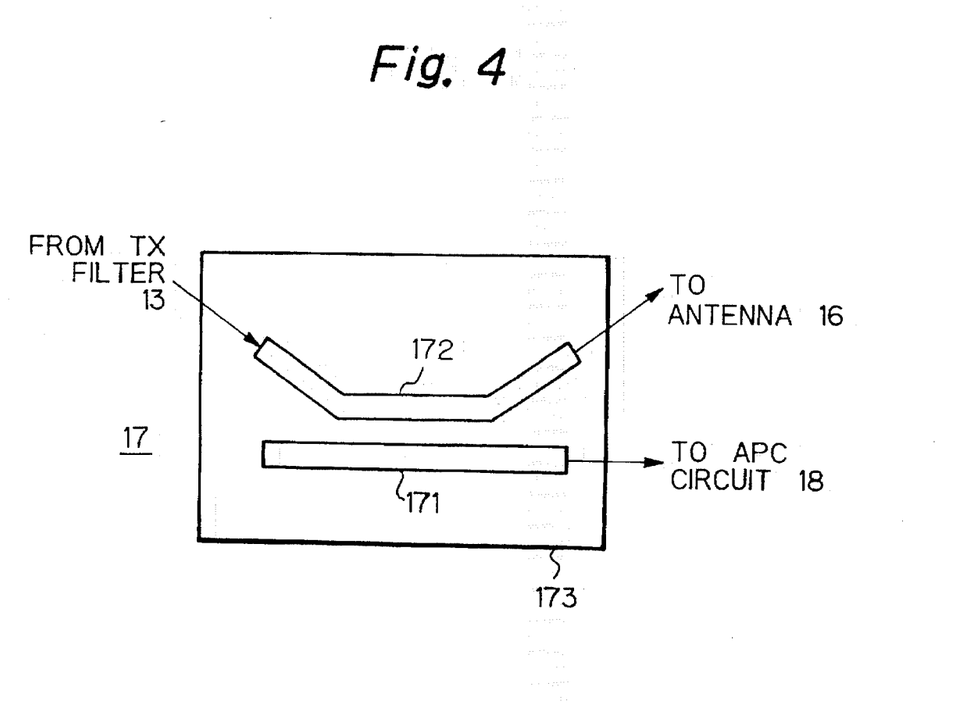
FIG. 4 is a plan view showing a specific configuration of a coupler included in the embodiments of FIGS. 1 and 3.

The illustrative embodiment differs from the conventional device in respect of a control loop for controlling the output power. Specifically, the coupler 17, playing the role of an output power sensor, is inserted in a radio frequency path comprising the transmission portion 14a of the branching circuit 14 and assigned to transmission. As shown in FIG. 4 specifically, the coupler 17 has a dielectric substrate 173 and two conductors 171 and 172 provided on the substrate 173. With such a microstrip line type configuration, the coupler 17 serves as a side-coupling directional coupler. The coupler 17 produces part of the output signal of the TX filter 13 from the radio frequency path comprising transmission portion 14a of the braching circuit 14 and delivers it to the APC circuit 18 in the form of an electric signal. The reference signal 51 is applied from the controller 50 to the APC circuit 18, as stated earlier. The APC circuit 18 generates, based on the output of the coupler 17 and reference signal 51, a gain control signal for matching the power of the output of the TX filter 13 to the reference signal 51. The gain control signal is fed to the power amplifier 11.

While the coupler 17 is a specific form of an output power sensor and may be replaced with, for example, a branch line, it is more desirable than the others because it scarcely affects the transmission of a signal. In this embodiment, the coupler 17 disposed in the branching circuit 14 forms part of the duplexer 20 together with the TX filter 13, branching circuit 14, and RX filter 19.

The APC circuit 18 has a detector 30, a comparator 31, an amplifier 32 and a reference voltage generator 33. The detector 30 detects the output of the coupler 17 and generates a detection voltage (DC voltage) representative of its mean level. The detection signal from the detector 30 is fed to the comparator 31. Because the coupler 17 is disposed in the transmission portion 14a of the branching circuit 14, it produces a part of the reflected signal from the radio frequency path comprising the transmission portion 14a of the branching circuit 14. However, this part is far lower in level than the produced part of the signal to be transmitted. Therefore, the detection voltage can be freed from the influence of the reflected signal if the sensitivity of the coupler 17 and that of the detector 30 are selected adequately.

Figure 5:
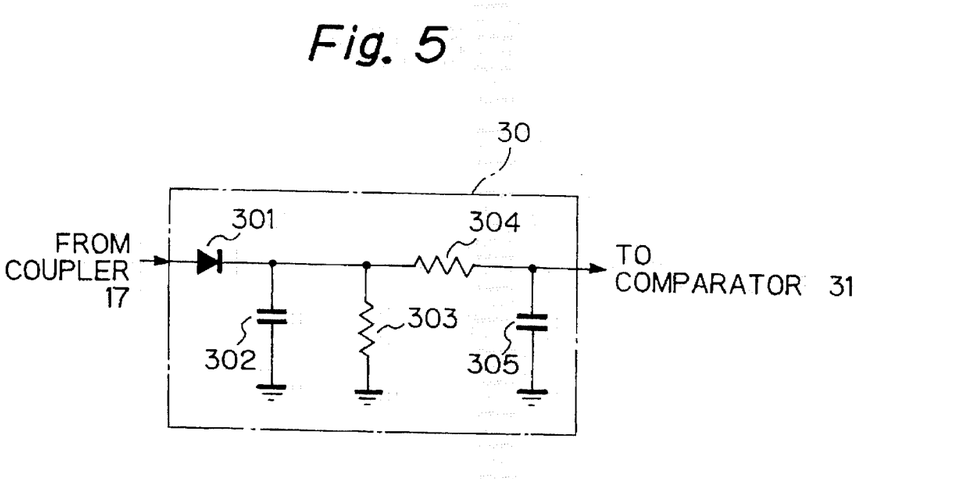
FIG. 5 is a circuit diagram representative of a detector also included in the embodiments of FIGS. 1 and 3.

To change the detection sensitivity, in the specific configuration of FIG. 4, the distance between the two lines 171 and 172 may be changed. Alternatively, the kind and composition of the dielectric substrate 173 may be changed to change the dielectric constant in the gap between the lines 171 and 172. FIG. 5 shows a specific arrangement of the detector 30. As shown, the detector 30 has a diode 301, capacitors 302 and 305, and resistors 303 and 304. With these constituents, the detector 30 performs half-wave rectification of a frequency modulated (FM) signal to be transmitted thereby separating a DC component for inputting to the comparator 31. In this case, the detection sensitivity may be changed by varying the capacity of the capacitor 302. Further, assume that the output of the detector 30 is divided in voltage by two resistors, and the divided voltage is applied to the amplifier 32 (FIG. 1), the detection sensitivity may be changed by varying the ratio between the two resistors. It is to be noted that the detection sensitivity is selected at the design stage of the communication device.

When the communication device has an access system conforming to a TDD (Time Division Duplex) system or Ping-Pong transmission system, the detection voltage will be free from the influence of the received signal if an output power control loop, which will be described later, is activated only during transmission. Presumably, inserting the coupler 17 in the branching circuit 14 has not been thought of in the past because of the fear that it would produce a part of the reflected signal from the radio frequency path comprising the transmission portion 14a of the branching circuit 14.

In the APC circuit 18, a reference voltage 52 from the reference voltage generator 33 is also applied to the comparator 31. Specifically, the reference voltage 52 is generated by the controller 50 and reference voltage generator 33, as follows. The controller 50 determines, in response to the output RSSI of the IF circuit 42 and representative of the strength of a received signal, the reference value of the output power of a signal to be sent. The reference value is any one of, for example, eight stepwise values each of which differs by 4 dB. The reference signal 51 from the controller 50 designates one of the eight different reference values, i.e., has one of the values from "0" to "7" corresponding to the determined reference value. The reference signal 51 is a three-bit signal, and is delivered to the reference voltage generator 33 over three signal lines. In response, the generator 33 generates a reference voltage 52 corresponding to the designated reference value.

An alternative scheme replacing the RSSI scheme stated above is as follows. Assume that a command relating to the reference value of the output power is sent from a base station to the communication device as part of the control data. Then, the controller 50 will select an adequate reference value as designated by the command from the base station.

The comparator 31 produces a voltage representative of the difference between the instantaneous detection voltage from the detector 30 and the reference voltage 52 from the reference voltage generator 33, i.e., between the actual output power and the reference output power. The voltage from the comparator 31 is amplified by the amplifier 32 and then fed to the power amplifier 11 as a gain control signal 181.

Figure 6:
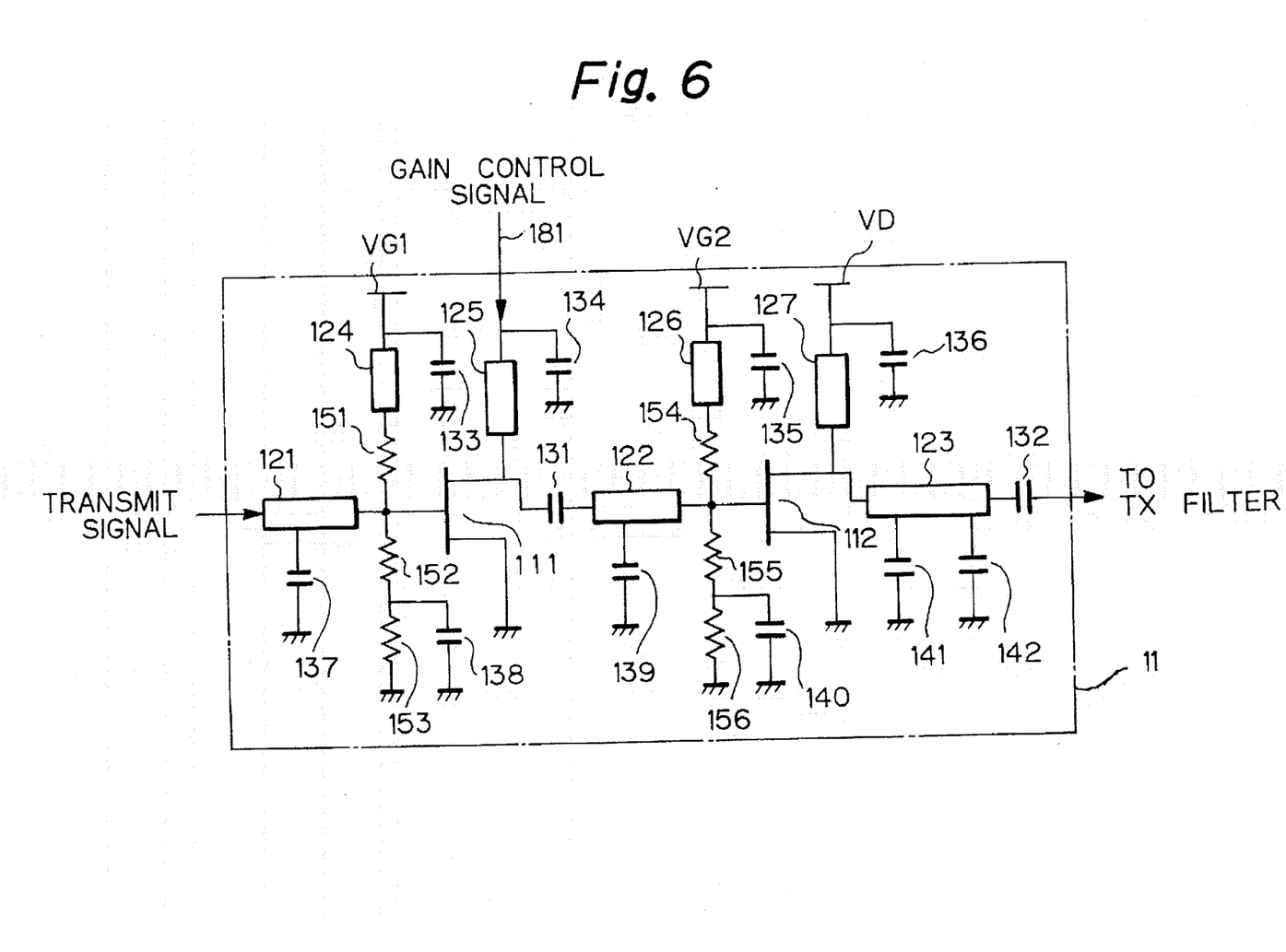
FIG. 6 is a circuit diagram showing a specific arrangement of a power amplifier further included in the embodiments of FIGS. 1 and 3.

When the power amplifier 1 11 comprises an FET (Field-Effect Transistor) for amplifying the signal to be transmitted, the gain control signal 181 may be the voltage applied to the drain of the FET. In this case, in order to increase the gain of the FET, the drain voltage, i.e., the gain control signal is increased. FIG. 6 shows the power amplifier including two FETs 111 and 112, which are connected in cascade. In FIG. 6, the gain control signal 181 is applied to the drain electrode of the FET 111. In addition to the FETs 111 and 112, the power amplifier 11 comprises strip lines 121–123, stubs 124–127, capacitors 131–142, and resistors 151–156. A voltage VG1 and the gain control signal 181 are applied to, the gate electrode and the drain electrode of the FET 111, respectively. Voltages VG2 and VD are applied to the gate electrode and the drain electrode of the FET 112, respectively.

As a result, the gain of the power amplifier 11 is so changed as to bring the detection voltage into coincidence with the reference voltage. This provides the output of the TX filter 13, i.e., the signal to be transmitted with the preselected power. Even if the TX filter 13 has a pass band deviation and low return loss, the output of the filter 13 surely achieves the preselected power without regard to its frequency because the output power control loop operates on the basis of the deviation of the detection voltage, which is detected from the output of the filter 13, from the reference voltage.

As stated above, in the illustrative embodiment, the coupler or output power sensor 17 is inserted in the radio frequency path included in the branching circuit 14 and assigned to transmission. The coupler 17 forms part of the output power control loop. Hence, even when the TX filter 13 has a pass band deviation and low return loss, the output power can be stably controlled to a preselected value. This successfully prevents the output power from differing from one channel (carrier frequency) to another channel.

As discussed above, FIG. 2 shows a specific conventional mobile communication device in which a coupler 7 intervenes between a power amplifier 1 and a TX filter 3, i.e., it does not follow the TX filter 3. In this circuitry, it is likely that the output power changes from one channel to another channel because a signal to be transmitted via an antenna 6 is susceptible to the pass band deviation and low return loss of the TX filter 3. In FIG. 2, there are also shown a branching circuit 84, an APC circuit 88, and a RX filter 9.

Further, in the embodiment of the invention shown in FIG. 1, the TX filter 13, branching circuit 14, RX filter 19, and coupler 17 included in the circuit 14 constitute the duplexer 20 which is a single unit or part. It follows that the number of parts of the device which need adjustment after assembly is reduced. Consequently, the output power control circuitry can be implemented easily in a small size.

Figure 3:
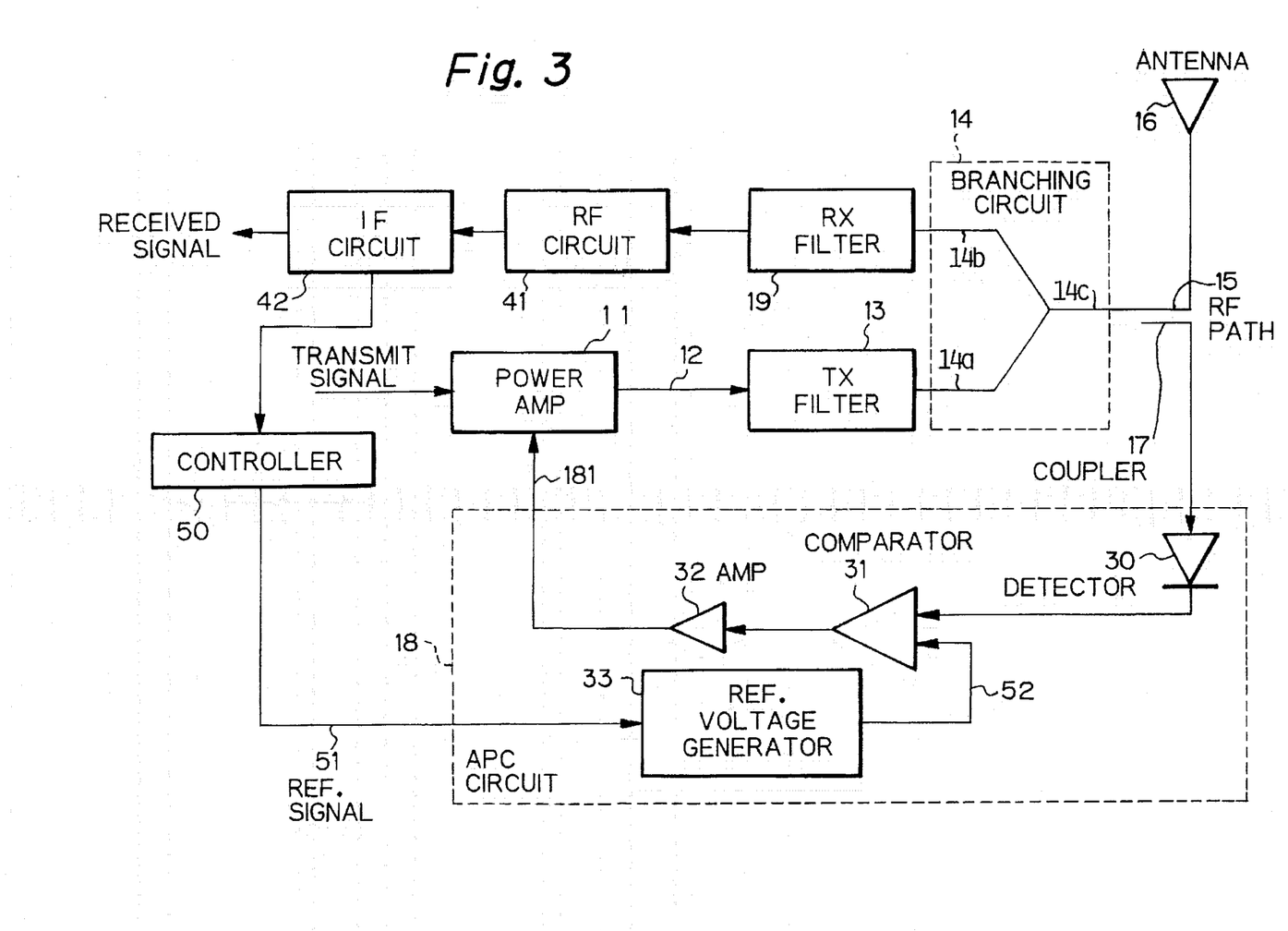
FIG. 3 is a block diagram schematically showing an alternative embodiment of the present invention.

Referring to FIG. 3, an alternative embodiment of the present invention will be described. In FIG. 3, the same constituent parts as the parts shown in FIG. 1 are designated by the same reference numerals, and a detailed description thereof will not be made in order to avoid redundancy. As shown, this embodiment is similar to the previous embodiment except that the coupler 17 is inserted in the radio frequency signal line 15 connecting the branching circuit 14 and the antenna 16. However, the coupler 17 is again located so as to follow the TX filter 13. This embodiments operates in the same manner as the previous embodiment although the position of the coupler 17 is different.

The embodiment described with reference to FIG. 3 has the following advantages. First, even when the TX filter 13 has a pass band deviation and low return loss, the output power can be stably controlled to a preselected value, as stated in relation to the previous embodiment. This successfully prevents the output power from differing from one channel (carrier frequency) to another channel. Assume that a frequency deviation and low return loss are caused by the mismatching between the branching circuit 14 and the radio frequency signal path 15 connected to the antenna 16. Even in this condition, the output power can be stabilized at a preselected value because the coupler 17 is inserted in the path 15, and the control loop operates in response to the output of the coupler 17. This also prevents the output power from differing from one channel (carrier frequency) to another channel. The words "frequency deviation" mentioned above refer to an occurrence that the output power of the signal fed from the branching circuit 14 to the radio frequency path 15 changes with a change in the frequency of the signal. Another advantage is that the embodiment is practicable with a commercially available duplexer.

In the alternative embodiment, the coupler 17 senses the levels of received signals more than in the previous embodiment. However, when the device has an access system conforming to a TDD system or Ping-Pong transmission system, the detection voltage will be free from the influence of the received signal, if the output power control loop is activated only during transmission, as stated in relation to the previous embodiment. Further, the detection voltage can be freed from the influence of the reflected signal if the sensitivity of the coupler 17 and that of the detector 30 are selected adequately.

In summary, in accordance with the present invention, a mobile communication device having output-power control circuitry has an output power sensor succeeding a TX filter and causes an output power control loop to operate in response to the output of the sensor. Hence, even when the TX filter involves a pass band deviation and low return loss, the device surely controls output power to a preselected value.

Also, in accordance with the present invention, a duplexer has the output power sensor in its branching circuit. This implements the output power control circuitry and, therefore, a mobile communication device may be easily incorporated in a miniature configuration for the following reason. If the power output sensor is not included in the duplexer and located to follow the TX filter, the person designing the device must additionally take account of, for example, the coupling state between the filter and an antenna. This increases the range of parts and coupling which should be taken into account. Moreover, if the various parts of the duplexer are not arranged integrally with each other, the number of parts needing adjustment after assembly increases, and the adjustment is complicated. To facilitate the adjustment, the individual parts should be strictly controlled in performance.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention. For example, while the specifically disclosed embodiments have concentrated on a mobile phone, the present invention is, of course, applicable to a transceiver or similar mobile communication device. Further, the present invention is applicable even to a transmitting device and or a base station included in a mobile communication system.

What is claimed is:

1. A mobile communication device having a transmitting function and a receiving function, and comprising:

a power amplifier for amplifying power of an input signal to be transmitted;

a transmitter filter for limiting a frequency band of the input signal amplified by said power amplifier to a predetermined frequency band for transmission;

a branching circuit for isolating a transmitting section from a receiving section, and for passing therethrough the input signal having its frequency limited by said transmitter filter;

an antenna having a transmitting function and a receiving function connected to said branching circuit, for radiating to the air the input signal passing through said branching circuit; and output power control circuitry for controlling output power of the input signal;

said branching circuit comprising:

a transmission path for passing therethrough the input signal having its frequency limited by said transmitter filter;

a receiving path for passing therethrough a received signal coming in through said antenna; and an antenna path for branching said transmission path and said receiving path, connected to said antenna, and passing the input signal from said transmission path to said antenna and the received signal from said antenna to said receiving path;

said transmission path, said receiving path and said antenna path being integrated into said branching circuit;

said output power control circuitry comprising:

an output power sensor succeeding said transmitter filter in a direction of flow of the input signal provided on said transmission path included in said branching circuit, integrated with said branching circuit, for sensing the output power of the input signal; and an automatic power control circuit for controlling a gain of said power amplifier such that the output power sensed by said output power sensor coincides with a predetermined reference value.

2. A device in accordance with claim 1, wherein said output power sensor comprises a coupler.

3. Output power control circuitry for a mobile communication device which has a transmitting function and a receiving function, amplifies power of an input signal to be transmitted by a power amplifier, limits a frequency band of the input signal amplified by said power amplifier to a predetermined frequency band for transmission by a transmitter filter, isolates a transmitting section from a receiving section by a branching circuit, passes the input signal limited in frequency band by said transmitter filter through said branching circuit, and transmits the input signal lying in said predetermined frequency band via an antenna, wherein said antenna has a transmitting function and a receiving function and is connected to said branching circuit, and said branching circuit comprises:

a transmission path for passing therethrough the input signal limited in frequency band by said transmitter filter;

a receiving path for passing therethrough a received signal coming in through said antenna; and an antenna path for branching said transmission path and said receiving path, connected to said antenna, and passing the input signal from said transmission path to said antenna and the receiving signal from said antenna to said receiving path;

said transmission path, said receiving path and said antenna path being integrated into said branching circuit;

said circuitry comprising:

an output power sensor succeeding said transmitter filter in a direction of flow of the input signal, provided on said transmission path included in said branching circuit, integrated with said branching circuit, for sensing the output power of the input signal; and an automatic power control circuit for controlling a gain of said power amplifier such that the output power sensed by said output power sensor coincides with a predetermined reference value.

4. Circuitry in accordance with claim 3, wherein said output power sensor comprises a coupler.

5. A duplexer comprising:

a transmitter filter for limiting a frequency band of an input signal to be fed to an antenna to a predetermined frequency band for transmission;

a receiver filter for separating from a received signal coming in through the antenna frequency components lying in a predetermined frequency band for receiving;

a branching circuit for isolating said transmitter filter from said receiving filter connected to said antenna; and an output power sensor provided on a transmission path included in said branching circuit, for sensing an output power of the input signal to be fed to said antenna;

said branching circuit comprising:

a transmission path for passing therethrough the input signal limited in frequency band by said transmitter filter;

a receiving path for passing therethrough a received signal coming in through said antenna; and an antenna path for branching said transmission path and said receiving path, connected to said antenna, and passing the input signal from said transmission path to said antenna and the receiving signal from said antenna to said receiving path;

said transmission path, said receiving path and said antenna path being integrated into said branching circuit; and said output power sensor being integrated with said branching circuit.

6. A duplexer in accordance with claim 5, wherein said output power sensor comprises a coupler.

7. A mobile communication device comprising:

a transmitting section including a power amplifier 1 having a first input, a second input and an output, an input signal having a frequency band being applied to the first input of said power amplifier; and a transmitter filter having an input connected to the output of said power amplifier 1, said transmitter filter limiting the frequency band of said input signal to predetermined frequency components;

a receiving section;

an antenna for transmitting said input signal and for receiving an incoming signal;

a branching circuit having first, second and third portions, a first end of each of said first, second and third portion being connected to a common junction for isolating the transmitting section from the receiving section of said device, the first portion of said branching circuit having a second end coupled to an output of said transmitter filter, the second portion of said branching circuit having a second end coupled to said receiving section and the third portion of said branching circuit having a second end coupled to said antenna, said input signal being transmitted from the output of said transmitter filter to said antenna along the first and third portions of said branching circuit, and a received signal being transmitted from said antenna to the receiving section along the third and second portions of said branching circuit; and output power control circuitry for controlling the power of the input signal transmitted from said antenna, including an output power sensor coupled to the first portion of said branching circuit for sensing the output power of said input signal; and an automatic power control circuit connecting said output power sensor to the second input of said power amplifier for controlling a gain of said power amplifier, the output power sensed by said output power sensor coinciding with a predetermined reference value.

8. A device in accordance with claim 7 wherein said automatic power control circuit comprises:

a detector coupled to said output power sensor for detecting the output thereof and generating at an instantaneous DC detection voltage;

a reference voltage generator for receiving a reference signal and generating a reference voltage corresponding to the strength of said received signal;

a comparator coupled to outputs of said detector and said reference voltage generator for producing at an output thereof a voltage corresponding to the difference between said instantaneous DC detection voltage and said reference voltage; and means coupling the output of said comparator to the second input of said power amplifier for controlling the gain thereof.

9. A device in accordance with claim 8 wherein said receiving section includes a receiver filter having an input connected to the second portion of said branching filter and an output, said receiver filter separating the predetermined frequency components from said received signal; and which device further comprises a controller having an input connected to the output of said receiver filter, and an output connected to an input of said reference voltage generator to provide said reference signal.

10. A device in accordance with claim 8 wherein said output sensor comprises a substrate having first and second conductors mounted thereon, said first conductor being coupled between said transmitter filter and said antenna and said second conductor being coupled to said detector.

* * * * *